United States Patent
Kim et al.

(10) Patent No.: US 9,806,036 B2
(45) Date of Patent: Oct. 31, 2017

(54) SEMICONDUCTOR WAFER, SEMICONDUCTOR STRUCTURE AND METHOD OF MANUFACTURING THE SEMICONDUCTOR WAFER

(71) Applicant: Samsung Electronics Co., Ltd., Suwon-si, Gyeonggi-do (KR)

(72) Inventors: Jong-soo Kim, Incheon (KR); Sam-jong Choi, Suwon-si (KR); Sue-ryeon Kim, Hwaseong-si (KR); Tae-hyoung Koo, Hwaseong-si (KR); Hyun-hee Ju, Hwaseong-si (KR); Cheong-jun Kim, Hwaseong-si (KR); Ji-won You, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/354,320

(22) Filed: Nov. 17, 2016

(65) Prior Publication Data
US 2017/0200683 A1    Jul. 13, 2017

(30) Foreign Application Priority Data
Jan. 8, 2016   (KR) .................. 10-2016-0002779

(51) Int. Cl.
*H01L 21/02*   (2006.01)
*H01L 29/06*   (2006.01)
(Continued)

(52) U.S. Cl.
CPC ...... *H01L 23/562* (2013.01); *H01L 21/02013* (2013.01); *H01L 21/02035* (2013.01);
(Continued)

(58) Field of Classification Search
CPC ............ H01L 2924/14; H01L 2224/94; H01L 21/302; H01L 22/12; H01L 2223/54493;
(Continued)

(56) References Cited

U.S. PATENT DOCUMENTS 5,060,043 A  * 10/1991  Yasue .................. H01L 23/544
                                                            257/627
5,684,599 A    11/1997  Shimoyama et al.
(Continued)

FOREIGN PATENT DOCUMENTS

JP    11-297799       10/1999
JP    2005-254343 A   9/2005
(Continued)

*Primary Examiner* — Jasmine Clark
(74) *Attorney, Agent, or Firm* — Harness, Dickey & Pierce, P.L.C.

(57) ABSTRACT

A semiconductor wafer including a main body including first and second surfaces opposite each other, a notch including a recess on an outer periphery, a first bevel region formed along the outer periphery of the main body, including a first slope connecting the first and second surfaces and having a first height with respect to a straight line extending from a first point where the first surface and the first slope meet to a second point where the second surface and the first slope meet, and a second bevel region in contact with the recess or opening, including a second slope connecting the first and second surfaces and having a second height, different from the first height, with respect to a straight line extending from a third point where the first surface and the second slope meet to a fourth point where the second surface and the second slope meet.

20 Claims, 8 Drawing Sheets

(51) Int. Cl.
*H01L 23/00* (2006.01)
*H01L 21/66* (2006.01)
*H01L 21/324* (2006.01)
*H01L 23/544* (2006.01)

(52) U.S. Cl.
CPC ........ *H01L 21/0262* (2013.01); *H01L 21/324* (2013.01); *H01L 22/12* (2013.01); *H01L 23/544* (2013.01); *H01L 2223/54493* (2013.01)

(58) Field of Classification Search
CPC ............. H01L 23/562; H01L 21/02013; H01L 21/02035; H01L 23/544; H01L 21/561; H01L 2924/00014; H01L 21/02087; H01L 21/67282; H01L 21/02002
See application file for complete search history.

(56) References Cited

U.S. PATENT DOCUMENTS

| | | | |
|---|---|---|---|
| 5,993,292 A | 11/1999 | Oishi et al. | |
| 6,439,969 B1 | 8/2002 | Koma et al. | |
| 6,747,337 B1 | 6/2004 | Yamamoto et al. | |
| 7,393,759 B2 | 7/2008 | Hidaka et al. | |
| 8,562,390 B2 | 10/2013 | Kobayashi et al. | |
| 2004/0124413 A1* | 7/2004 | Arai | H01L 21/67259 257/48 |
| 2004/0129940 A1* | 7/2004 | Iwase | H01L 23/544 257/48 |
| 2005/0070074 A1* | 3/2005 | Priewasser | B24B 7/228 438/462 |
| 2006/0079155 A1* | 4/2006 | Nakamura | B24B 7/228 451/41 |
| 2009/0057847 A1* | 3/2009 | Nakayama | C30B 29/406 257/627 |
| 2013/0049210 A1* | 2/2013 | Endo | H01L 24/08 257/773 |
| 2014/0007901 A1 | 1/2014 | Chen et al. | |

FOREIGN PATENT DOCUMENTS

| | | |
|---|---|---|
| JP | 2014-232780 A | 12/2014 |
| KR | 10-2006-0074742 | 3/2006 |

\* cited by examiner

SEMICONDUCTOR WAFER, SEMICONDUCTOR STRUCTURE AND METHOD OF MANUFACTURING THE SEMICONDUCTOR WAFER

CROSS-REFERENCE TO RELATED APPLICATION

This application claims the benefit of Korean Patent Application No. 10-2016-0002779, filed on Jan. 8, 2016, in the Korean Intellectual Property Office, the disclosure of which is incorporated herein in its entirety by reference.

BACKGROUND

Example embodiments of the inventive concepts relate to a semiconductor wafer, a semiconductor structure and/or a method of manufacturing the semiconductor wafer.

A process of manufacturing a semiconductor device may be performed at a relatively high temperature due to microfabrication and complication with regard to a semiconductor circuit, which may result in a decrease in a design rule thereof. A large amount of heat may be applied to a semiconductor wafer when the process temperature increases, and thus, the semiconductor wafer may be damaged.

Meanwhile, a notch may be mainly used to indicate a crystal direction of a semiconductor wafer having a diameter of 300 micro meters or more, and the notch may be used to align semiconductor wafers during a semiconductor manufacturing process.

SUMMARY

Example embodiments of the inventive concepts provide a semiconductor wafer configured to reduce (or, alternatively, eliminate) damage from occurring to a notch during a high temperature process, a semiconductor structure including the semiconductor wafer, and a method of manufacturing the semiconductor wafer.

According to an example embodiment of the inventive concepts, there is provided a method of manufacturing a semiconductor wafer, the method including preparing a semiconductor wafer, the semiconductor wafer including first and second surfaces opposite each other and a notch on an outer periphery of the semiconductor wafer, the notch including a recess on the outer periphery toward a center portion of the semiconductor wafer; forming, by processing the outer periphery of the semiconductor wafer, a first bevel region, the first bevel region including a first slope connecting the first and second surfaces, the first slope having a first height with respect to a straight line extending from a first point to a second point, the first point being a point where the first surface and the first slope meet, and the second point being a point where the second surface and the first slope meet; and forming, by processing the notch, a second bevel region, the second bevel region contacting the recess, the second bevel region including a second slope connecting the first and second surfaces, the second slope having a second height, different from the first height, with respect to a straight line extending from a third point to a fourth point, the third point being a point where the first surface and the second slope meet, and the fourth point being a point where the second surface and the second slope meet.

According to another example embodiment of the inventive concepts, there is provided semiconductor wafer including a main body including first and second surfaces opposite each other; a notch on an outer periphery of the semiconductor wafer, the notch including a recess on the outer periphery toward a center portion of the semiconductor wafer; a first bevel region along the outer periphery of the main body, the first bevel region including a first slope connecting the first and second surfaces, the first slope having a first height with respect to a straight line extending from a first point to a second point, the first point being a point where the first surface and the first slope meet, and the second point being a point where the second surface and the first slope meet; and a second bevel region in contact with the recess, the second bevel region including a second slope connecting the first and second surfaces, the second bevel region having a second height, different from the first height, with respect to a straight line extending from a third point to a fourth point, the third point being a point where the first surface and the second slope meet, the fourth point being a point where the second surface and the second slope meet.

According to another example embodiment of the inventive concepts, there is provided a semiconductor structure including a semiconductor wafer having first and second surfaces opposite each other, the semiconductor wafer including a chip forming region, and an edge region surrounding the chip forming region; semiconductor chips arranged in the chip forming region; a notch on an outer periphery of the semiconductor wafer, the notch including a recess on the outer periphery toward a center portion of the semiconductor wafer; a first bevel region along the outer periphery of the semiconductor wafer, the first bevel region having a first slope connecting the first and second surfaces, and the first bevel region having a first height with respect to a straight line extending from a first point to a second point, the first point being a point where the first surface and the first slope meet, the second point being a point where the second surface and the first slope meet; and a second bevel region in contact with the recess, the second bevel region having a second slope connecting the first and second surfaces, and the second bevel region having a second height, different from the first height, with respect to a straight line extending from a third point to a fourth point, the third point being a point where the first surface and the second slope meet, and the fourth point being a point where the second surface and the second slope meet.

According to another example embodiment of the inventive concepts, there is provided a method of manufacturing a semiconductor wafer, the semiconductor wafer including first and second surfaces opposite each other and a notch on an outer periphery of the semiconductor wafer. The method including first processing the outer periphery of the semiconductor wafer to form a first bevel region, the first bevel region being convexly beveled at a first slope between the first and second surfaces, the first bevel region having a first height at a highest point thereof with respect to a start of the first bevel region; and second processing the notch to form a second bevel region, the second bevel region contacting the recess, the second bevel region having a second slope between the first and second surfaces, the second slope having a second height at a deepest point thereof with respect to the outer periphery, the second height being different from the first height.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
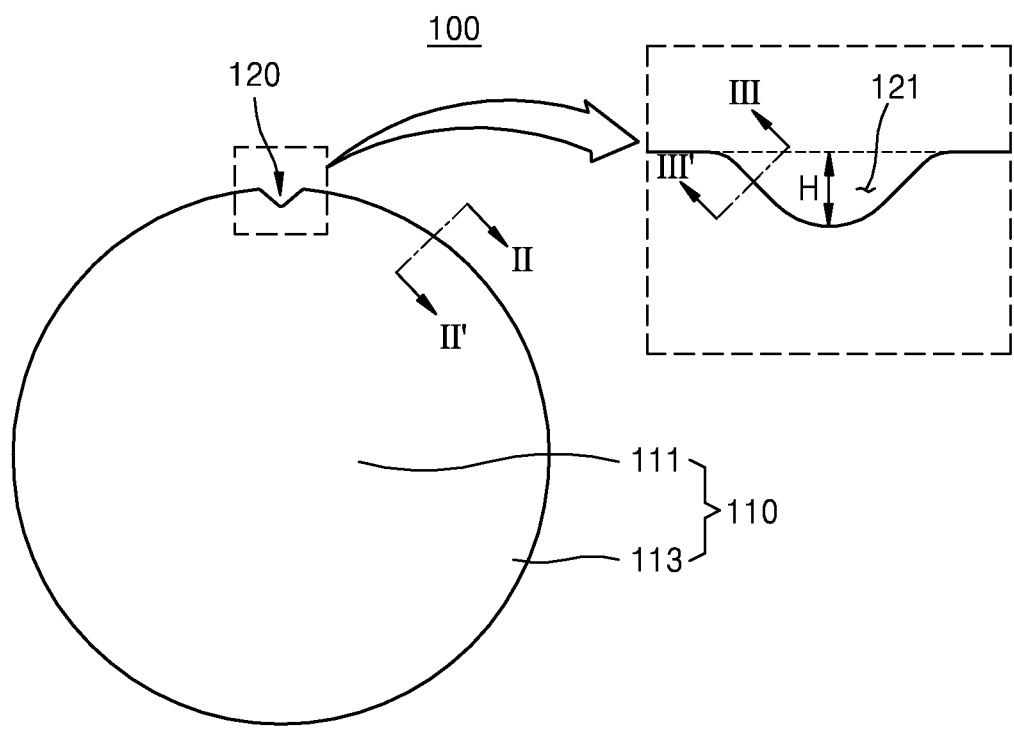
FIG. 1 is a plan view illustrating a semiconductor wafer according to an example embodiment.
Figure 2:
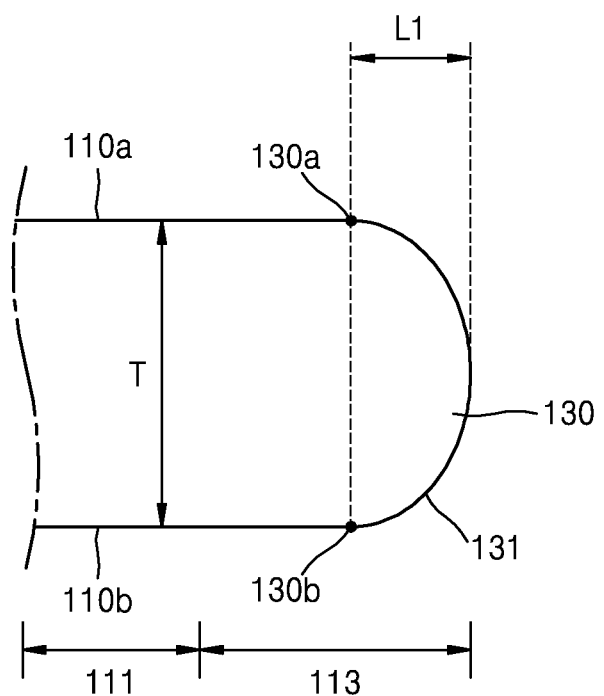
FIG. 2 is a cross-sectional view illustrating the semiconductor wafer of FIG. 1 taken along a line II-II'.
Figure 3:
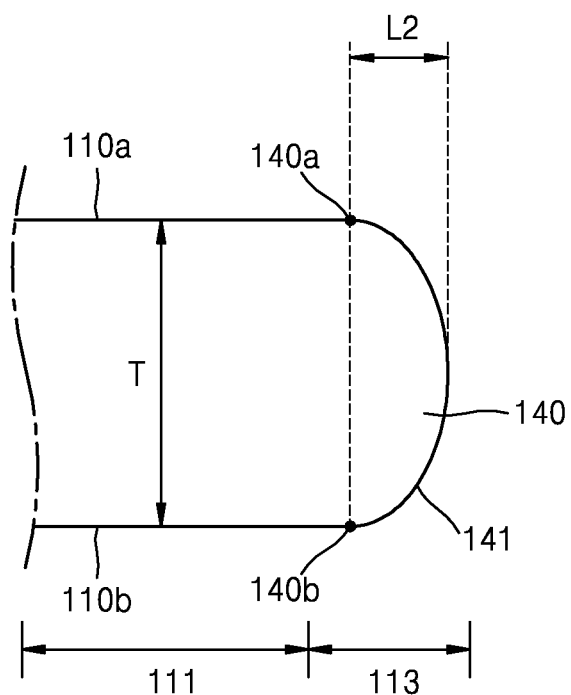
FIG. 3 is a cross-sectional view illustrating the semiconductor wafer of FIG. 1 taken along a line III-III'.

FIG. 1 is a plan view illustrating a semiconductor wafer 100 according to an embodiment of the present disclosure. FIG. 2 is a cross-sectional view illustrating the semiconductor wafer 100 of FIG. 1 taken along a line II-II'. FIG. 3 is a cross-sectional view illustrating the semiconductor wafer 100 of FIG. 1 taken along a line III'-III'.

Referring to FIGS. 1 to 3, the semiconductor wafer 100 may include a main body 110, a notch 120, and first and second bevel regions 130 and 140.

The semiconductor wafer 100 may be a silicon wafer, or may include a semiconductor element such as germanium (Ge) or a compound semiconductor such as silicon carbide (SiC), gallium arsenide (GaAs), indium arsenide (InAs), and indium phosphide (InP). Furthermore, the semiconductor wafer 100 may be a silicon-on-insulator.

The main body 110 may determine the entire shape of the semiconductor wafer TOO. The main body 110 may include a chip forming region 111 in which a passive device, an active device or an integrated circuit is formed, and an edge region 113 surrounding the chip forming region 111. The main body 110 may include first and second surfaces 110a and 110b opposite and substantially parallel to each other. The main body 110 may have a certain thickness (for example, a distance between the first and second surfaces 110a and 110b of the main body 110).

The notch 120 may be used for including a crystal direction of the semiconductor wafer 100 and may be formed in the edge region 113 of the main body 110. The notch 120 may include a recess or opening 121 formed to a certain depth in a direction toward a center portion of the main body 110 from an outer periphery of the main body 110. The recess or opening 121 may extend in a thickness direction of the semiconductor wafer 100.

The notch 120 may be formed in the semiconductor wafer 100 to align the semiconductor wafer 100 during a semiconductor manufacturing process. For example, after being attached to a rotatable support means, the semiconductor wafer 100 may be aligned by rotating the semiconductor wafer 100 and detecting the notch 120 by a detection sensor such as a laser sensor.

Additionally, as illustrated in FIG. 1, in a view perpendicular to the first surface 110a of the main body 110, the notch 120 may include an end with a curved shape (for example, a "U" shape). For example, a contacting portion of the recess or opening 121 and the main body 110 may form a curved shape in a direction perpendicular to the first surface 110a of the main body 110.

However, example embodiments are not limited thereto. For example, unlike in FIG. 1, the notch 120 may include an end with a sharpened shape, for example, a "V" shape in a view perpendicular to the first surface 110a of the main body 110. For example, a contacting portion of the recess or opening 121 and the main body 110 may form a "V" shape in a direction perpendicular to the first surface 110a of the main body 110.

According to example embodiments, a depth H of the recess or opening 121 toward the center portion of the main body 110 from the outer periphery of the main body 110 may be around 0.4 micro meters to around 1.0 micro meters. The depth H of the recess or opening 121 in the direction perpendicular to the first surface 110a may indicate a distance extending closest to the center portion of the main body 110 from the outer periphery of the main body 110. The depth H of the recess or opening 121 may be a depth of the notch 120. When the depth H of the recess or opening 121 is less than about 0.4 micro meters, a detection sensor such as a laser sensor may not accurately detect the notch 120, and thus, the semiconductor wafer 100 may not be aligned.

Furthermore, the depth H of the recess or opening 121 may be about 1.0 micro meters or less in order to reduce damage to the notch 120 or a region adjacent to the notch 120. A temperature and/or a pressure in a process of manufacturing a semiconductor device may increase due to microfabrication and complications of a semiconductor circuit, which may result in a decrease in a design rule thereof and an increase in requirements with respect to the manufacturing process.

The high temperature and/or the high pressure of the process may damage the notch 120 and the region adjacent to the notch 120, and a yield of the semiconductor manufacturing process may be reduced as a result. Therefore, the notch 120 is required to have a size less than a certain level to reduce damage to the notch 120. According to some example embodiments, a defect to the notch 120 or the region adjacent to the notch 120 during a semiconductor manufacturing process may be reduced by reducing the depth H of the recess or opening 121 to 1.0 micro meters or less.

The first bevel region 130, in the edge region 113 of the main body 110, may be formed along an outer periphery of the main body 110. The first bevel region 130 may include a first slope 131 connecting the first and second surfaces 110a and 110b of the main body 110. The first slope 131 may have a convex shape.

With respect to a straight line extending from a first point 130a where the first surface 110a and the first slope 131 meet to a second point 130b where the second surface 110b and the first slope 131 meet, the first bevel region 130 may have a first height L1 in a radial direction of the semiconductor wafer 100. The first height L1 may be a bevel length.

§

In other words, a thickness of the semiconductor wafer 100 may be reduced from the first and second points 130a and 130b, and the thickness of the semiconductor wafer 100 may be reduced in a radial direction of the semiconductor wafer 100 with respect to a straight line connecting the first and second points 130a and 130b as a reference. The thickness of the semiconductor wafer 100 may be reduced as a height of the first bevel region 130 with respect the straight line connecting the first and second points 130a and 130b increases. As illustrated in FIG. 2, a boundary of the chip forming region 111 and the edge region 113 may be spaced apart from the first point 130a or the second point 130b where the first slope 131 starts. However, unlike in FIG. 2, the boundary of the chip forming region 111 and the edge region 113 may be almost same as the first point 130a or the second point 130b.

A distance of from a center of the semiconductor wafer 100 to a point where a height of the first bevel region 130 is the first height L1 may be a radial length of the semiconductor wafer 100.

For example, the semiconductor wafer 100 may have a certain thickness in the first bevel region 130 by performing a slicing process with a single crystal ingot, and due to the first bevel region 130, corners of the semiconductor wafer 100 may be rounded. Also, due to the first bevel region 130, a sharp edge of the semiconductor wafer 100 may be rounded, and thus, the semiconductor wafer 100 may be prevented from being broken during a following process of manufacturing the semiconductor wafer 100 or a semiconductor device.

Meanwhile, referring to FIG. 3, the second bevel region 140 may be formed in the notch 120 along an end of the notch 120 provided by the recess or opening 121. The second bevel region 140 may include a second slope 141 connecting the first and second surfaces 110a and 110b of the main body 110, in which the second slope 141 may have a convex shape. The second slope 141 may have a profile different from that of the first slope 131 provided in the first bevel region 130.

With respect to a straight line extending from a third point 140a where the first surface 110a and the second slope 141 meet to a fourth point 140b where the second surface 110b and the second slope 141 meet, the second bevel region 140 may have a second height L2 in a direction of the recess or opening 121 from the main body 110. The second height L2 may be a bevel length. The second height L2 of the second bevel region 140 may be different from the first height L1 of the first bevel region 130.

In other words, a thickness of the semiconductor wafer 100 may be reduced from the third and fourth points 140a and 140b, and the thickness of the semiconductor wafer 100 may be reduced in a direction toward the recess or opening 121 from the main body 110 with a straight line connecting the third and fourth points 140a and 140b as a reference. The thickness of the semiconductor wafer 100 may be reduced in the notch 120 as a height of the second bevel region 140 with respect the straight line connecting the third and fourth points 140a and 140b as a reference increases.

As illustrated in FIG. 3, a boundary of the chip forming region 111 and the edge region 113 may be spaced apart from the third point 140a or the fourth point 140b where the second slope 132 starts. However, unlike in FIG. 3, the boundary of the chip forming region 111 and the edge region 113 may be almost same as the third point 140a or the fourth point 130b.

The second bevel region 140, for example, may be formed by performing grinding and polishing processes on the notch 120. Due to the second bevel region 140, an end of the notch 120 provided by the recess or opening 121 may be rounded, and thus, the notch 120 may be prevented from being damaged during a semiconductor manufacturing process.

Additionally, the second bevel region 140 formed in the notch 120 may be connected to the first bevel region 130 formed along an outer periphery of the semiconductor wafer 100. In a portion where the first and second bevel regions 130 and 140 are adjacent to each other, a height of the first bevel region 130 may be changed from the first height L1 to the second height L2 and a height of the second bevel region 140 may be changed from the second height L2 to the first height L1. For example, in a portion where the first and second bevel regions 130 and 140 are adjacent to each other, the height of the first bevel region 130 or the second bevel region 140 may be between the first height L1 and the second height L2.

In some example embodiments, the second height L2 of the second bevel region 140 may be less than the first height L1 of the first bevel region 130. For example, the second height L2 of the second bevel region 140 may be less than about 90% of the first height L1 of the first bevel region 130. As illustrated in FIGS. 2 and 3, comparing the first bevel region 130 and the second bevel region 140 with respect to a cross-section perpendicular to the first surface 110a of the main body 110, an end of the second bevel region 140 may have a profile almost perpendicular to that of the first bevel region 130. Therefore, chippings in the notch 120 generated during a process of manufacturing the semiconductor water 100 or a semiconductor device may be reduced.

Furthermore, in some example embodiments, a thickness T of the main body 110, that is, a distance between the first and second surfaces 110a and 110b may be three or more times as great as the second height L2 of the second bevel region 140. For example, a semiconductor wafer of a diameter of about 300 micro meters may have a thickness of about 775 micro meters, and the second height L2 of the second bevel region 140 may be 250 micro meters or less.

Figure 4:
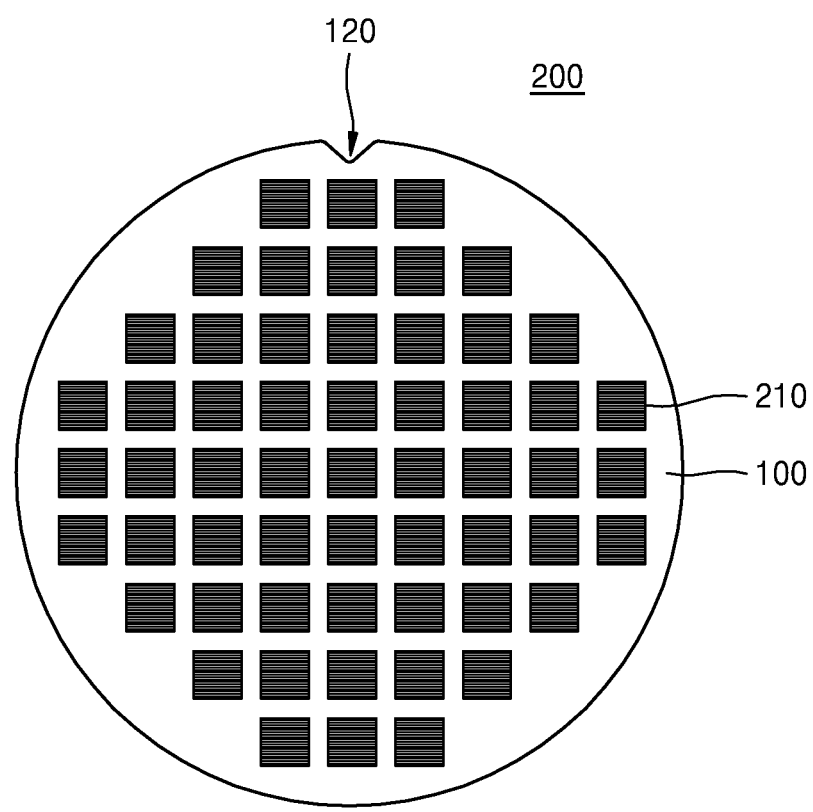
FIG. 4 is a plan view illustrating a semiconductor structure according to an example embodiment.

FIG. 4 is a plan view of a semiconductor structure 200 according to an example embodiment of the present disclosure.

Referring to FIG. 4, the semiconductor structure 200 may include a semiconductor wafer 100, a notch 120 formed on an edge of the semiconductor wafer 100, the first bevel region 130 (of FIG. 2), the second bevel region 140 (of FIG. 3), and semiconductor chips 210 formed on a surface of the semiconductor wafer 100. The semiconductor wafer 100, the notch 120, the first bevel region 130, and the second bevel region 140 are substantially the same as those described in FIGS. 1 to 3, and thus, detailed descriptions thereof will not be given for convenience of descriptions.

The semiconductor chips 210, except a part of an outer area the semiconductor wafer 100, may be arranged over the entire surface of the semiconductor wafer 100. For example, the semiconductor chips 210 may be formed in the chip forming region 111 (of FIG. 1) of the semiconductor wafer 100. Each of the semiconductor chips 210 may include an integrated circuit. For example, the integrated circuit may include a memory circuit or a logic circuit. Furthermore, the semiconductor chips 210 may include various kinds of individual devices. The individual devices may include a variety of microelectronic elements, for example, a metal-oxide semiconductor field-effect transistor (MOSFET) such as a complementary metal oxide semiconductor (CMOS) transistor, an image sensor such as a system large scale integration (LSI) or a CMOS imaging sensor (CIS), micro electro mechanical systems (MEMS), an active device, and a passive device.

Figure 5:
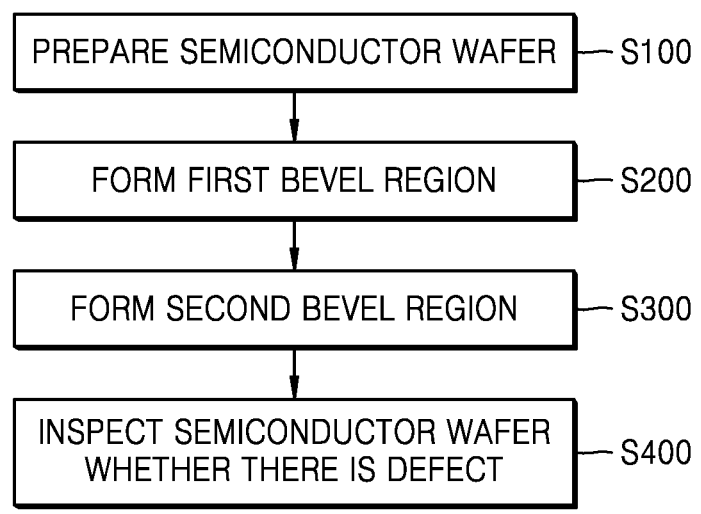
FIG. 5 is a flowchart of a method of manufacturing a semiconductor wafer according to an example embodiment.

FIG. 5 is a flowchart of a method of manufacturing the semiconductor wafer 100 according to an example embodiments.

Referring to FIG. 5 with FIGS. 1 to 3, in operation S100, the semiconductor wafer 100 may be prepared. The semiconductor wafer 100 may include the first and second surfaces 110a and 110b opposite each other. The notch 120, including the recess or opening 121 formed toward the center portion of the semiconductor wafer 100 from the outer periphery of the semiconductor wafer 100, may be included in the outer periphery of the semiconductor wafer 100.

For example, the semiconductor wafer 100 may be a silicon wafer and the semiconductor wafer 100 may be prepared by forming the single crystal ingot, and slicing the single crystal ingot with a certain thickness. In detail, the single crystal ingot may be formed by melting high-purity amorphous polycrystalline silicon, contacting a single crystal seed to the polycrystalline silicon in a liquid state, and slowly lifting the seed. Afterwards, the notch 120 may be formed along a length direction of the single crystal ingot by cutting both ends of the single crystal ingot and by grinding lateral surfaces of the single crystal ingot. Next, the single crystal ingot may be cut into a certain thickness by slicing.

Next, in operation S200, the first bevel region 130 may be formed on edge of the semiconductor wafer 100. The first bevel region 130 may be formed along an outer periphery of the semiconductor wafer 100 excluding the notch 120. The first bevel region 130 may be formed by rounding a corner of the outer periphery of the semiconductor wafer 100.

The first bevel region 130 may include the first slope 131 in a convex shape connecting the first and second surfaces 110a and 110b of the semiconductor wafer 100, and thus, may prevent the semiconductor wafer 100 from being broken during a semiconductor manufacturing process. The first bevel region 130 may have the first height L1 in a radial direction of the semiconductor wafer 100 with a straight line extending from the first point 130a where the first surface 110a of the semiconductor wafer 100 and the first slope 131 meet to the second point 130b where the second surface 110b of the semiconductor wafer 100 and the first slope 131 meet, as a reference.

In operation S300, the second bevel region 140 may be formed on a contacting portion of the recess or opening 121 of the notch 120 and the main body 110. The second bevel region 140, for example, may be formed by performing grinding and/or polishing processes on the notch 120. The second bevel region 140 may include the second slope 141 in a convex shape connecting the first and second surfaces 110a and 110b of the semiconductor wafer 100 through the grinding and polishing processes. The second bevel region 140 may have the second height L2 in a direction toward the recess or opening 121 from the main body 110 with a straight line extending from the third point 140a where the first surface 110a of the semiconductor wafer 100 and the second slope 141 meet to the fourth point 140b where the second surface 110b of the semiconductor wafer 100 and the second slope 141 meet, as a reference. The second height L2 of the second bevel region 140 may be different from the first height L1 of the first bevel region 130. Next, lapping and/or polishing processes may be performed to flatten a surface of the semiconductor wafer 100 and remove a defect.

In operation S400, the semiconductor wafer 100 may be inspected to determine whether there is a defect. The inspection of the semiconductor wafer 100 may be performed only on some of a plurality of semiconductor wafers 100 generated from a single crystal ingot. The inspection may be performed before a following process with respect to the semiconductor wafer 100, and may determine whether defects occur or not in advance during the following process, and thus, may prevent a defective semiconductor wafer 100 from being applied to the following process. Therefore, reliability and a yield of a semiconductor manufacturing process may be improved.

Figure 6:
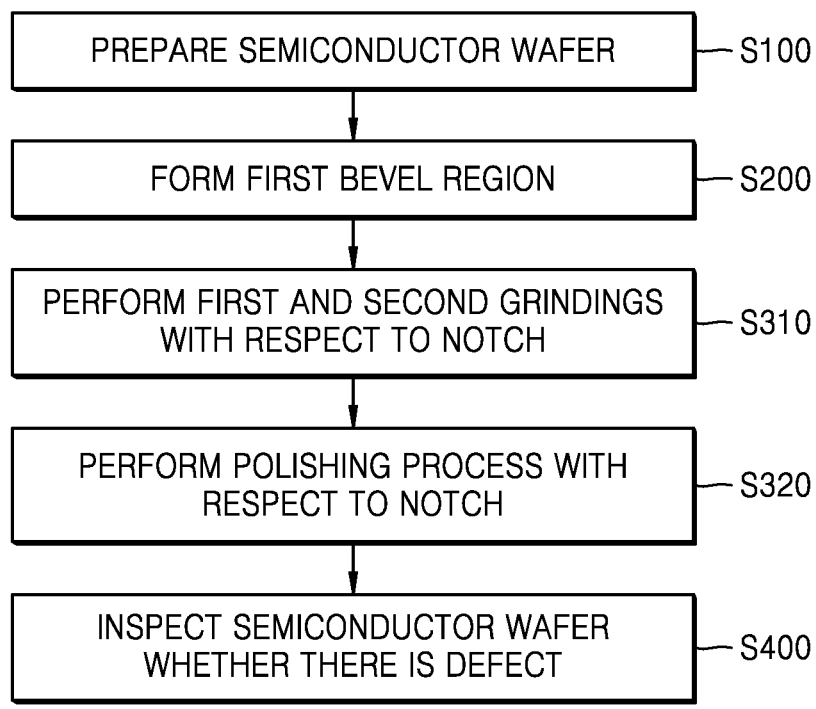
FIG. 6 is a flowchart of a method of manufacturing a semiconductor wafer according to an example embodiment.

FIG. 6 is a flowchart of a method of manufacturing the semiconductor wafer 100 according to an example embodiment.

Referring to FIG. 6, operation S100 of preparing the semiconductor wafer 100, operation S200 of forming the first bevel region 130, and operation S400 of inspecting the semiconductor wafer 100 are substantially the same as those described in FIG. 5, and thus, detailed descriptions thereof will not be given for convenience of descriptions.

Hereinafter, operations S310 and S320 of forming the second bevel region 140 will be described in detail referring to FIGS. 1 to 3 and 6.

In operation S310, first and second grindings may be performed with respect to the notch 120.

The first grinding may be performed by using a notch wheel having a polishing surface of a first mesh, wherein the notch wheel, for example, may polish the notch 120 by using particles of 800 meshes for polishing a diamond.

Next, the second grinding may be performed by using a notch wheel having a polishing surface of a second mesh larger than the first mesh. For example, the second mesh may be 2000 meshes or more, more in detail, may be about 2000 meshes to about 10000 meshes. In embodiments of the present disclosure, damage on the notch 120 may be reduced by using fine particles for the second grinding of the notch 120, and therefore, the notch 120 may not be broken during a semiconductor manufacturing process of high-temperature.

In operation S320, the second bevel region 140 may be formed in the notch 120 by performing a polishing process. A surface of the notch 120 may be flattened through the polishing process and defects in the notch 120 may be removed by a grinding process.

Figure 7:
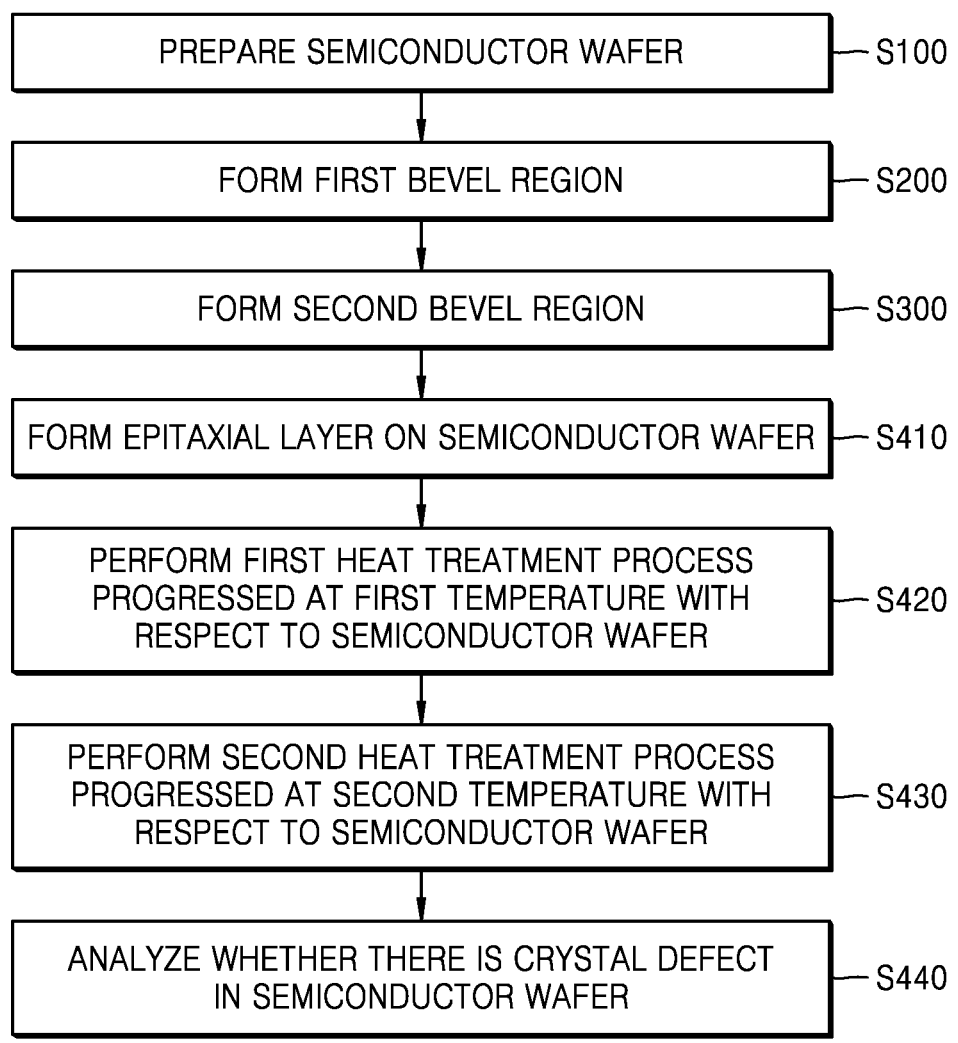
FIG. 7 is a plan view illustrating a method of manufacturing a semiconductor wafer according to an example embodiment.

FIG. 7 is a flowchart of a method of manufacturing the semiconductor wafer 100 according to an example embodiment.

Referring to FIG. 7, operation S100 of preparing the semiconductor wafer 100, operation S200 of forming the first bevel region 130, and operation S300 of forming the second bevel region 140 may be substantially the same as those described in FIGS. 5 and 6, and thus, detailed descriptions thereof will not be given for convenience of descriptions.

Hereinafter, operations S410 to S440 of inspecting the semiconductor wafer 100 will be described in detail referring to FIGS. 1 to 3 and 7.

In operation S410, an epitaxial layer may be formed on the semiconductor wafer 100. For example, the epitaxial layer may have a thickness of about 4 micro meters and may grow by being vapor-deposited in a reactor at a temperature of about 1,150 C. The epitaxial layer may be a single crystal layer having a crystal structure same as that of the semiconductor wafer 100. The epitaxial layer may be formed of a material same as or different from that of the semiconductor wafer 100. The epitaxial layer may be formed to easily inspect crystal defects on a surface of the semiconductor wafer 100.

Afterwards, in operation S420, a first heat treatment process progressed at a first temperature may be performed with respect to the semiconductor wafer 100. The first temperature of the first heat treatment process may be less than a second temperature of a second heat treatment process and the first heat treatment process may be progressed, for example, about 2 to 3 hours. The first temperature may be 1,000 C or more and less than 1,150 C. The first heat treatment process may be progressed at a temperature less than that of the following second heat treatment process, and may prevent the semiconductor wafer 100 from being damaged due to rapid temperature rise.

In operation S430, a second heat treatment process progressed at a second temperature may be performed with respect to the semiconductor wafer 100. The second temperature of the second heat treatment process may be performed at 1,150 C or more and the second heat treatment process may be progressed about an 1 hour to 2 hours. The second heat treatment process may be performed on the semiconductor wafer 100 under a condition more severe than in a following process such as a semiconductor manufacturing process and may test the semiconductor wafer 100 in advance whether the semiconductor wafer 100 can endure the following process. In particular, the second heat treatment process may test the notch 120 and a portion adjacent to the notch 120 easily causing a crystal defect, in advance.

In operation S440, the second heat treatment process may analyze whether there is a crystal defect in the semiconductor wafer 100. An X-ray photographing apparatus may be used to analyze a crystal defect of the semiconductor wafer 100. Then operation of inspecting the semiconductor wafer 100 may be progressed with respect to a selected part of semiconductor wafers of a single unit. A defective semiconductor wafer 100 may be scanned in advance by inspecting the semiconductor wafer 100, and processing reliabilities may be improved as the inspecting processes are performed only with respect to a non-defective semiconductor wafer 100.

Figure 8:
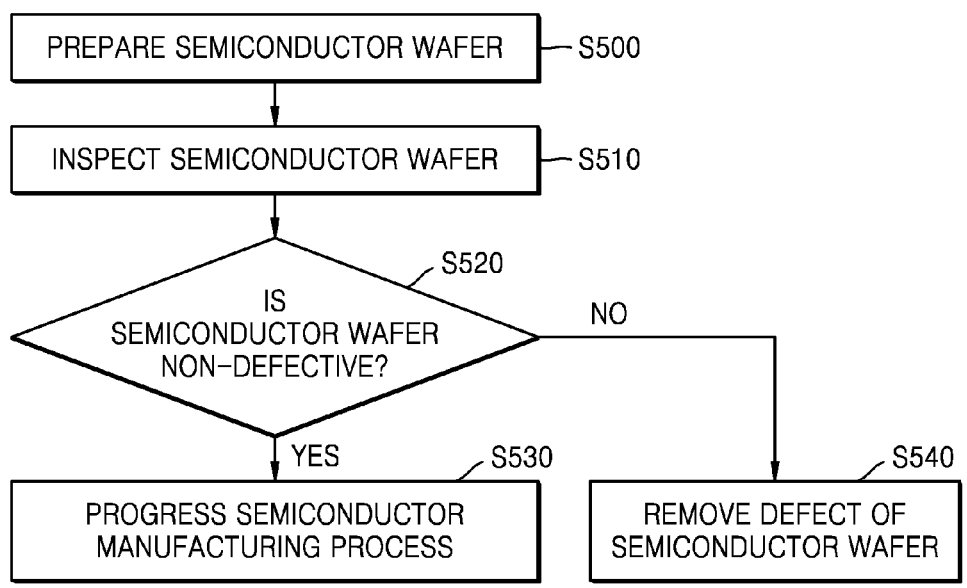
FIG. 8 is a flowchart of a method of manufacturing a semiconductor device according to an example embodiment.

FIG. 8 is a flowchart of a method of manufacturing a semiconductor device according to an example embodiment.

In operation S500, a semiconductor wafer may be prepared. The semiconductor wafer may be a semiconductor wafer generated through operations S100 to S300 of FIG. 5, or may be a semiconductor wafer generated through operations S100 to S320 of FIG. 6.

In operation S510, the semiconductor wafer may be inspected. The operation of inspecting the semiconductor water may be same as operations S410 to S440 of FIG. 7.

In operation S520, a determination may be made of whether the semiconductor wafer is defective or non-defective based on a result of inspecting the semiconductor wafer. Then the operation of inspecting the semiconductor wafer may be progressed with respect to some of a plurality of semiconductor wafers of a single unit.

In operation S530, when the semiconductor wafer is determined as non-defective according to the inspection result, a semiconductor manufacturing process may be progressed.

On the contrary, when the semiconductor wafer is determined as defective, in operation S540, the operation of inspecting the semiconductor wafer may remove a defect of the semiconductor wafer or discard the semiconductor wafer.

In detail, the semiconductor manufacturing process may be progressed as below. The semiconductor manufacturing process may include an operation of forming a thin film. The thin film may be formed of a conductive material, an insulating material, or a semiconductor material. The semiconductor manufacturing process may further include an operation of forming a mask pattern on the thin film. The mask pattern may be a photoresist pattern. Furthermore, the semiconductor manufacturing process, using the mask pattern as an etching mask, may further include an operation of forming a pattern by removing a part of the thin film. Furthermore, the semiconductor manufacturing process, using the mask pattern as an etching mask, may further include an operation of forming a hole by removing a part of the thin film. The hole may include, for example, a contact hole or a via hole.

The semiconductor manufacturing process may further include an operation of washing the thin film. The semiconductor manufacturing process may further include an operation of flattening the thin film. The operation of flattening the thin film may include a chemical mechanical polishing (CMP) process or an etch-back process. Furthermore, even though not mentioned in the description, the semiconductor manufacturing process may include other operations that may be performed during a semiconductor element manufacturing process. Therefore, the semiconductor manufacturing process may also include an operation of transferring or storing the semiconductor wafer.

While example embodiments of the inventive concepts have been particularly shown and described with reference to example embodiments thereof, it will be understood that various changes in form and details may be made therein without departing from the spirit and scope of the following claims.

What is claimed is:

1. A method of manufacturing a semiconductor wafer, the method comprising:
    preparing a semiconductor wafer, the semiconductor wafer including first and second surfaces opposite each other and a notch on an outer periphery of the semiconductor wafer, the notch including a recess on the outer periphery toward a center portion of the semiconductor wafer;
    forming, by processing the outer periphery of the semiconductor wafer, a first bevel region, the first bevel region including a first slope connecting the first and second surfaces, the first slope having a first height with respect to a straight line extending from a first point to a second point, the first point being a point where the first surface and the first slope meet, and the second point being a point where the second surface and the first slope meet; and
    forming, by processing the notch, a second bevel region, the second bevel region contacting the recess, the second bevel region including a second slope connecting the first and second surfaces such that the second bevel region is within the notch and the first bevel region is along a rest of the outer periphery of the semiconductor wafer abutting the second bevel region, the second slope having a second height, different from the first height, with respect to a straight line extending from a third point to a fourth point, the third point being a point where the first surface and the second slope meet, and the fourth point being a point where the second surface and the second slope meet.

2. The method of claim 1, wherein the second height is less than the first height.

3. The method of claim 1, wherein a thickness of a main body of the semiconductor wafer is at least three times larger than the second height.

4. The method of claim 1, wherein a depth of the recess is about 0.4 micro meters to about 1.0 micro meters.

5. The method of claim 1, wherein the forming of the second bevel region comprises:
    first grinding the notch using a notch wheel having a polishing surface of a first mesh; and
    second grinding the notch using a notch wheel having a polishing surface of a second mesh, the second mesh being larger than the first mesh.

6. The method of claim 5, wherein the second mesh includes about 2000 meshes to about 10000 meshes.

7. The method of claim 1, further comprising:
    inspecting the semiconductor wafer for defects by performing a heat treatment on the semiconductor wafer after the forming of the second bevel region, the inspecting including, performing the heat treatment on the semiconductor wafer at a first temperature; and performing the heat treatment on the semiconductor wafer at a second temperature, the second temperature being greater than the first temperature.

8. The method of claim 7, wherein the first temperature is between 1,000 C and 1,150 C.

9. The method of claim 7, wherein the inspecting further comprises:

forming an epitaxial layer on the semiconductor wafer before the performing of the heat treatment on the semiconductor wafer at the first temperature.

10. A semiconductor wafer comprising:

a main body including first and second surfaces opposite each other;

a notch on an outer periphery of the semiconductor wafer, the notch including a recess on the outer periphery toward a center portion of the semiconductor wafer;

a first bevel region along the outer periphery of the main body, the first bevel region including a first slope connecting the first and second surfaces, the first slope having a first height with respect to a straight line extending from a first point to a second point, the first point being a point where the first surface and the first slope meet, and the second point being a point where the second surface and the first slope meet; and a second bevel region in contact with the recess, the second bevel region including a second slope connecting the first and second surfaces such that the second bevel region is within the notch and the first bevel region is along a rest of the outer periphery of the semiconductor wafer abutting the second bevel region, the second bevel region having a second height, different from the first height, with respect to a straight line extending from a third point to a fourth point, the third point being a point where the first surface and the second slope meet, the fourth point being a point where the second surface and the second slope meet.

11. The semiconductor wafer of claim 10, wherein the main body includes a chip forming region and an edge region surrounding the chip forming region, the notch being in the edge region.

12. The semiconductor wafer of claim 10, wherein the second height is less than the first height.

13. The semiconductor wafer of claim 10, wherein a thickness of the main body is at least three times the second height.

14. The semiconductor wafer of claim 10, wherein a depth of the recess is about 0.4 micro meters to about 1.0 micro meters.

15. The semiconductor wafer of claim 10, wherein an end of the notch has a curved shape in a view perpendicular to the first surface of the main body.

16. A method of manufacturing a semiconductor wafer, the semiconductor wafer including first and second surfaces opposite each other and a notch on an outer periphery of the semiconductor wafer, the method comprising:

first processing the outer periphery of the semiconductor wafer to form a first bevel region, the first bevel region being convexly beveled at a first slope between the first and second surfaces, the first bevel region having a first height at a highest point thereof with respect to a start of the first bevel region; and second processing the notch to form a second bevel region, the second bevel region contacting the notch such that the second bevel region is within the notch and the first bevel region is along a rest of the outer periphery of the semiconductor wafer abutting the second bevel region, the second bevel region having a second slope between the first and second surfaces, the second slope having a second height at a deepest point thereof with respect to the outer periphery, the second height being different from the first height.

17. The method of claim 16, wherein the second processing includes grinding the notch incrementally using different meshes.

18. The method of claim 17, wherein the second processing comprises:

grinding the notch using a polishing surface having a first mesh; and grinding the notch using a polishing surface having a second mesh, the second mesh being larger than the first mesh.

19. The method of claim 16, further comprising:

first heating the semiconductor wafer to a first temperature;

second heating the semiconductor wafer to a second temperature, the second temperature being greater than the first temperature; and inspecting the semiconductor wafer for defects after the second heating.

20. The method of claim 19, further comprising:

forming an epitaxial layer on the semiconductor wafer before the first heating.

* * * * *